US009536788B1

(12) United States Patent
Ning et al.

(10) Patent No.: US 9,536,788 B1
(45) Date of Patent: Jan. 3, 2017

(54) COMPLEMENTARY SOI LATERAL BIPOLAR TRANSISTORS WITH BACKPLATE BIAS

(71) Applicant: International Business Machines Corporation, Armonk, NY (US)

(72) Inventors: Tak H. Ning, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/886,927

(22) Filed: Oct. 19, 2015

(51) Int. Cl.
| | |
|---|---|
| *H01L 21/8228* | (2006.01) |
| *H01L 21/84* | (2006.01) |
| *H01L 29/735* | (2006.01) |
| *H01L 29/66* | (2006.01) |
| *H01L 27/082* | (2006.01) |
| *H01L 29/06* | (2006.01) |
| *H01L 29/10* | (2006.01) |
| *H01L 29/08* | (2006.01) |

(52) U.S. Cl.
CPC .......... *H01L 21/8228* (2013.01); *H01L 21/84* (2013.01); *H01L 27/082* (2013.01); *H01L 29/0649* (2013.01); *H01L 29/0808* (2013.01); *H01L 29/0821* (2013.01); *H01L 29/1008* (2013.01); *H01L 29/6625* (2013.01); *H01L 29/735* (2013.01)

(58) Field of Classification Search
CPC .... H01L 21/8228; H01L 21/84; H01L 27/082; H01L 29/0649; H01L 29/0808; H01L 29/0821; H01L 29/1008; H01L 29/6625; H01L 29/735

USPC .......................................................... 257/526
See application file for complete search history.

(56) References Cited

U.S. PATENT DOCUMENTS

| | | | |
|---|---|---|---|
| 6,664,598 B1 | 12/2003 | Dennard et al. | 257/347 |
| 7,375,410 B2 | 5/2008 | Ho et al. | 257/526 |
| 7,709,313 B2 * | 5/2010 | Bryant | H01L 21/84 |
| | | | 257/E21.623 |
| 8,288,758 B2 | 10/2012 | Ning et al. | 257/19 |
| 8,420,493 B2 | 4/2013 | Ning et al. | 438/311 |
| 8,531,001 B2 | 9/2013 | Cai et al. | 257/526 |
| 8,704,329 B2 | 4/2014 | Qiao et al. | 257/500 |

(Continued)

FOREIGN PATENT DOCUMENTS

| | | | |
|---|---|---|---|
| CN | 102945851 A | 2/2013 | H01L 27/12 |
| JP | 09120994 A | 5/1997 | H01L 21/8228 |

OTHER PUBLICATIONS

Ning, et al., On the Performance and Scaling of Symmetric Lateral Bipolar Transistors on SOI, IEEE Journal of the Electron Devices Society, vol. 1, No. 1, Jan. 2013.

*Primary Examiner* — Yasser A Abdelaziez
(74) *Attorney, Agent, or Firm* — Ido Tuchman; Louis J. Percello

(57) ABSTRACT

A complementary bipolar junction transistor (BJT) integrated structure and methods for fabricating and operating such. The structure includes a monolithic substrate and conductive first and second backplates electrically isolated from each other. An NPN lateral BJT is superposed over the first backplate, and a PNP lateral BJT is superposed over the second backplate. A buried oxide (BOX) layer is positioned between the NPN lateral BJT and the first backplate, and between the PNP lateral BJT and the second backplate.

10 Claims, 15 Drawing Sheets

(56) References Cited

U.S. PATENT DOCUMENTS

| | | | |
|---|---|---|---|
| 8,847,348 B2 | 9/2014 | Cai et al. ........................ | 257/526 |
| 8,927,380 B2 | 1/2015 | Cai et al. ........................ | 438/311 |
| 8,933,512 B2 | 1/2015 | Zhu et al. ...................... | 257/347 |
| 2009/0127629 A1 | 5/2009 | Shafi ............................. | 257/370 |
| 2014/0088401 A1* | 3/2014 | Cai ..................... | H01L 31/1105 |
| | | | 600/407 |
| 2015/0061023 A1 | 3/2015 | Solaro et al. .................. | 257/348 |
| 2015/0287716 A1* | 10/2015 | Babcock ........... | H01L 21/26513 |
| | | | 257/492 |

\* cited by examiner

COMPLEMENTARY SOI LATERAL BIPOLAR TRANSISTORS WITH BACKPLATE BIAS

BACKGROUND

The present invention is directed toward semiconductor transistors, and more particularly to complementary lateral bipolar junction transistors (BJTs) and methods for fabrication such transistors.

From the mid to the late 1970's, there was a lot of excitement in the VLSI industry about the prospect of Integrated Injection Logic ($I^2L$). $I^2L$ is by far the densest circuit. It uses small sized devices, and requires one PNP per gate for current injection and only one NPN per fan-out. Thus an inverter with FO=3 takes only four transistors. The NPN transistors in an $I^2L$ circuit operate in the reverse-active mode. As a result, even with advanced self-aligned vertical Si-based BJT technology, $I^2L$ has minimum delays not much below one ns. This speed limitation, together with the rapid progress in complementary metal-oxide semiconductor (CMOS) scaling in the early 1980's, caused the demise of $I^2L$.

Digital logic is currently dominated by silicon CMOS circuits. It is desirable to reduce the operating voltage for CMOS circuits due to increased power consumption and heating in scaled CMOS technologies. However, CMOS performance is reaching a limit due to its poor signal-to-noise margins at low operating voltages (i.e., less than 0.5 volts).

In a BJT inverter circuit, the output current is exponentially dependent on the input voltage, giving much higher transconductance and potentially faster switching speed than CMOS. However, conventional vertical BJTs are generally not suitable for high density digital logic because of their large footprint due to isolation structure, their large parasitic capacitance due to the relatively large base-collector junction area, and associated minority carrier charge storage when biased in the saturation mode, that is when the collector-base diode is forward biased.

In contrast to vertical BJTs, when a lateral NPN transistor is turned on with a voltage $V_{BE}$, its base current flows vertically down from the base terminal and then turns and flows in the intrinsic base horizontally toward the emitter. The vertical base current flow causes a vertical IR drop between the top (p+/p interface) and the bottom (p/BOX interface) of the intrinsic base, causing $V'_{BE}$ (top) to be larger than $V'_{BE}$ (bottom). When this voltage difference is larger than kT/q, there is appreciable current crowding, with the local current density appreciably larger near the top than near the bottom. As the current increases, at some point the local minority-carrier density becomes larger than the majority-carrier density. Beyond that point, the dependence of current on $V_{BE}$ degrades. For a vertical transistor, this "current degradation" point is determined by the collector, which is the most lightly doped region. For a symmetric lateral transistor, the degradation point is determined by the base, which is the most lightly doped region.

In complementary thin-base symmetric lateral BJTs on SOI, there is the absence of a lightly doped collector. The lateral transistors have no deleterious base push out effect. Unlike vertical BJTs, there is no rapid performance drop off at high current densities. The lateral transistors operate equally fast in forward-active and reverse-active modes. The unique characteristics of symmetric lateral BJTs, with no base push out and equal speed in forward-active and reverse-active modes, suggest a need to rethink BJT circuits and circuit opportunities offered by the technology.

The layout of lateral BJT is similar to that of CMOS. One difference could be in the placement of metal contact to the extrinsic base. In CMOS, the metal contact to the gate is located away from the inversion channel region. In a BJT, if $r_{bx}$ is a concern, metal contact to the extrinsic base should be located over the intrinsic base, not away from the intrinsic base. If needed, two silicon thicknesses may be used, one for CMOS and one for lateral BJT.

BJTs (also referred to as bipolar transistors) are used in driver circuits where high current is required given the exponential dependence of the output current on the input voltage. On the other hand, BJTs are limited by the need of relatively large input voltage to achieve the target current level. The turn-on voltage of BJTs is dependent on the bandgap of the consisting materials. For BJTs made of Si, a typical turn-on voltage of approximately 0.9V to 1V is needed.

BRIEF SUMMARY

Accordingly, aspects of the present invention include complementary lateral BJT circuits with built-in dual backplates that enable simultaneous performance tuning of lateral NPN and PNP BJTs.

One example aspect of the present invention is a complementary bipolar junction transistor (BJT) integrated structure. The structure includes a monolithic substrate, an electrically conductive first backplate positioned over the monolithic substrate, and an electrically conductive second backplate positioned over the monolithic substrate. The first backplate and the second backplate are electrically isolated from each other. An NPN lateral BJT is superposed over the first backplate. A PNP lateral BJT is superposed over the second backplate. The NPN lateral BJT is configured to conduct electricity horizontally between an NPN emitter and an NPN collector when the NPN lateral BJT is active. The PNP lateral BJT is configured to conduct electricity horizontally between a PNP emitter and a PNP collector when the PNP lateral BJT is active. A first buried oxide (BOX) layer is positioned between the NPN lateral BJT and the first backplate, and between the PNP lateral BJT and the second backplate.

Another example aspect of the present invention is a method of operating a complementary bipolar junction transistor (BJT) circuit. The method includes biasing a first backplate with positive voltage such that a first collector current through an NPN lateral BJT superposing the first backplate is increased when the NPN lateral BJT is active. Another biasing operation biases a second backplate with negative voltage such that a second collector current through a PNP lateral BJT superposing the second backplate is increased when the PNP lateral BJT is active. The first backplate and the second backplate are electrically isolated from each other and are carried by a monolithic substrate.

A further example aspect of the present invention is a method for fabricating a complementary bipolar junction transistor (BJT) integrated structure. The method includes forming a first backplate in a monolithic substrate below a first buried oxide (BOX) layer. Another forming step forms a second backplate in the monolithic substrate below the first BOX layer. The second backplate is electrically isolated from the first backplate. Another forming step forms an NPN lateral BJT above the first BOX layer and superposing the first backplate. The NPN lateral BJT is configured to conduct electricity horizontally between an NPN emitter and an NPN collector when the NPN lateral BJT is active. Another forming step forms a PNP lateral BJT superposing the second backplate. The PNP lateral BJT is configured to conduct electricity horizontally between a PNP emitter and a PNP collector when the PNP lateral BJT is active.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
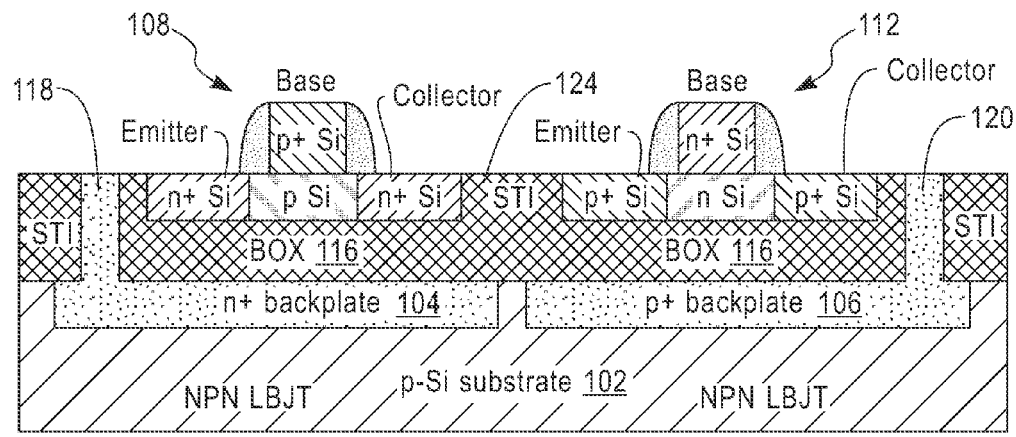
FIG. 1 shows an example complementary BJT integrated structure contemplated by the present invention.

The present invention is described with reference to embodiments of the invention. Throughout the description of the invention reference is made to FIGS. 1-29. When referring to the figures, like structures and elements shown throughout are indicated with like reference numerals.

An aspect of the present invention is a complementary lateral bipolar junction transistor (BJT) circuit with built-in dual backplates that enable performance tuning of NPN and PNP simultaneously. As discussed further below, the complementary lateral BJTs with backplate bias beneficially increases Ic as a function of the backplate bias voltages with relatively little change in Ib.

FIG. 1 shows an example complementary BJT integrated structure contemplated by the present invention. The structure includes a monolithic substrate 102. In one embodiment, the substrate 102 is composed of p-doped silicon.

The structure includes an electrically conductive first backplate 104 positioned over the monolithic substrate 102. In one embodiment, the first backplate 104 is n+ doped. In addition, the structure includes an electrically conductive second backplate 106 positioned over the monolithic substrate 102. In one embodiment, the first backplate 106 is p+ doped. The first backplate 104 and the second backplate 106 are electrically isolated from each other.

The structure includes an NPN lateral BJT 108 superposing the first backplate 104. Thus, the first backplate is positioned under the NPN lateral BJT 108. The NPN lateral BJT includes an NPN base. Furthermore, the NPN lateral BJT 108 is configured to conduct electricity horizontally between an NPN emitter and an NPN collector when the NPN lateral BJT 108 is active.

The structure also includes a PNP lateral BJT 112 superposing the second backplate 106. The second backplate 106 is positioned under the PNP lateral BJT 112. The PNP lateral BJT includes a PNP base. Furthermore, the PNP lateral BJT 112 is configured to conduct electricity horizontally between a PNP emitter and a PNP collector when the PNP lateral BJT 112 is active. In one embodiment, the top surfaces of the NPN emitter, the NPN collector, the PNP emitter and the PNP collector are on the same horizontal plane.

The structure includes a buried oxide (BOX) layer 116 positioned between the NPN lateral BJT 108 and the first backplate 104, and between the PNP lateral BJT 112 and the second backplate 106. A first contact 118 is electrically coupled to the first backplate 104 and extends vertically from the first backplate 104 through the BOX layer 116. A second contact 120 is electrically coupled to the second backplate 106 and extends vertically from the second backplate 106 through the BOX layer 116. The structure may include a shallow trench isolation (STI) 124 between the NPN lateral BJT 108 and the PNP lateral BJT 112. The complementary BJT integrated structure may include a plurality of NPN lateral BJTs superposing the first backplate 104 and a plurality of PNP lateral BJTs superposing the second backplate 106.

Figure 2:
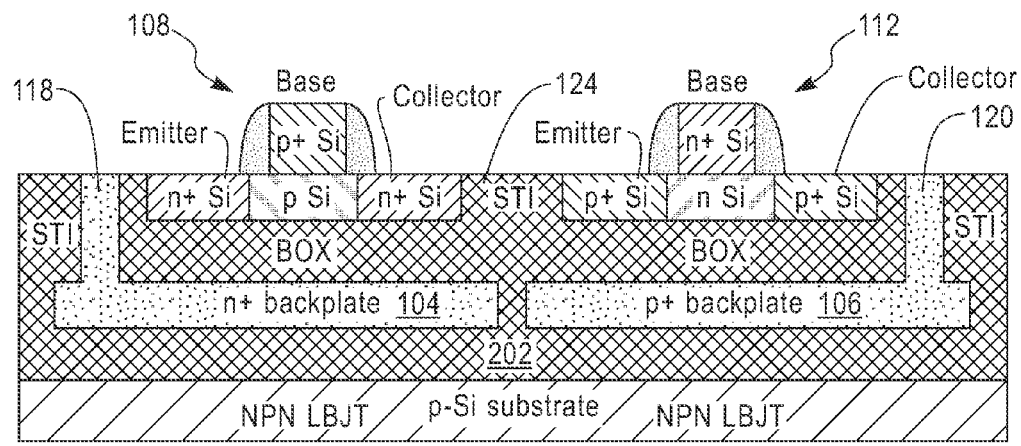
FIG. 2 shows another embodiment of the complementary BJT integrated structure contemplated by the present invention.

FIG. 2 shows another embodiment of the complementary BJT integrated structure. In this embodiment, a second BOX layer 202 is positioned between the first backplate 104 and the monolithic substrate 102, and between the second backplate 106 and the monolithic substrate 102. Thus, the first backplate 104 and the second backplate 106 are electrically isolated from the monolithic substrate 102 by the second BOX layer 202.

Figure 3:
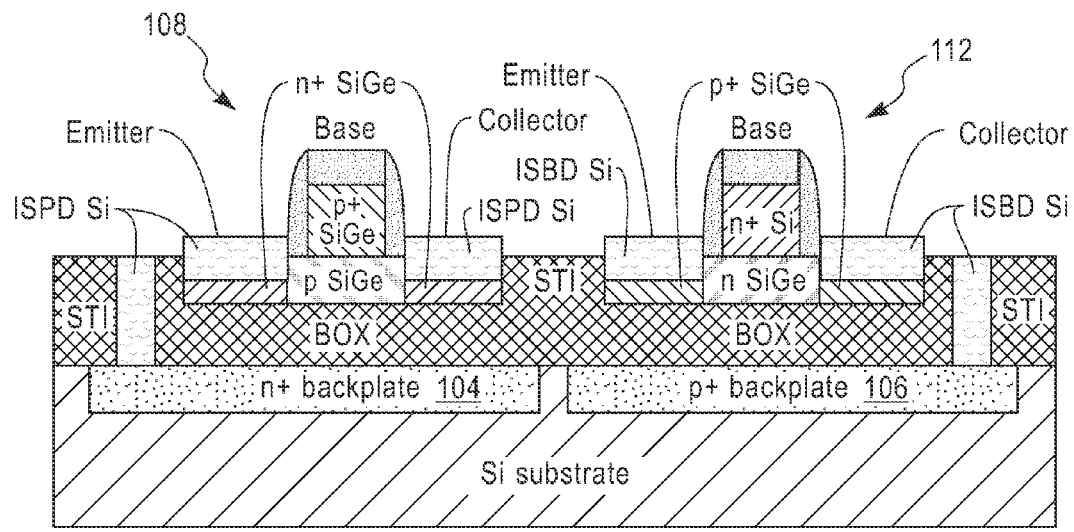
FIG. 3 shows another embodiment of the complementary BJT integrated structure contemplated by the present invention.

FIG. 3 shows another embodiment of the complementary BJT integrated structure. In this embodiment the NPN lateral BJT and the PNP lateral BJT are heterojunction BJTs. When used with narrow-gap base, (Si-emitter and SiGe-base structures), the embodiment provides an additional collector current increase from the narrow-gap-base heterojunction bipolar transistor effect. It is contemplated that the heterojunction bipolar transistor design may be combined with the double BOX structure shown in FIG. 2.

Figure 4:
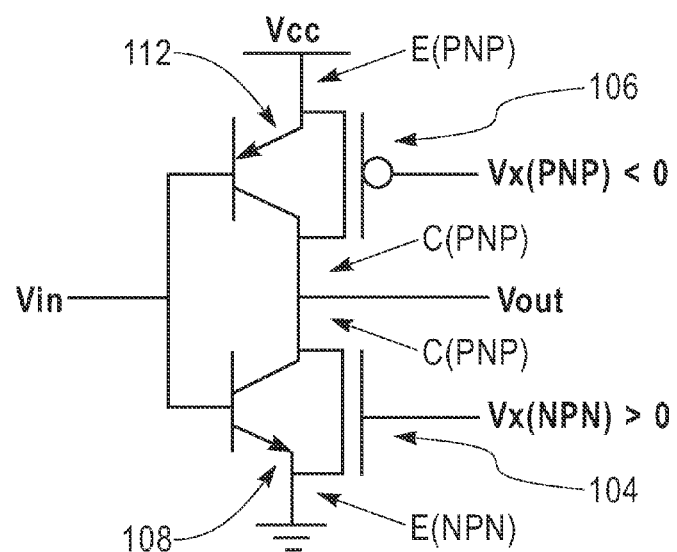
FIG. 4 shows another embodiment of the complementary BJT integrated structure contemplated by the present invention.

FIG. 4 shows another embodiment of the complementary BJT integrated structure. In this embodiment the NPN base is electrically coupled to the PNP base and the NPN collector is electrically coupled to the PNP collector to form a silicon-on-insulator (SOI) complementary bipolar inverter. The SOI lateral PNP can be viewed as a pFET, with emitter as source, collector as drain, substrate of the PNP as the gate, and PNP base is body of the pFET. Likewise, the SOI lateral NPN can be viewed as an nFET, with emitter as source, collector as drain, substrate of the NPN as the gate, and NPN base as body of the nFET.

In the case of the NPN structure and a +ve substrate bias, the 4-terminal device is an NPN BJT in parallel with an nFET. Notice that the NPN structure does not work if a −ve substrate bias is employed because an nFET is not operated with −ve gate bias. Similarly, in the case of the PNP structure and a −ve substrate bias, the 4-terminal device is a PNP BJT in parallel with a pFET. The PNP structure does not work if a +ve substrate is employed bias because a pFET does not operate with +ve gate bias.

Figure 5:
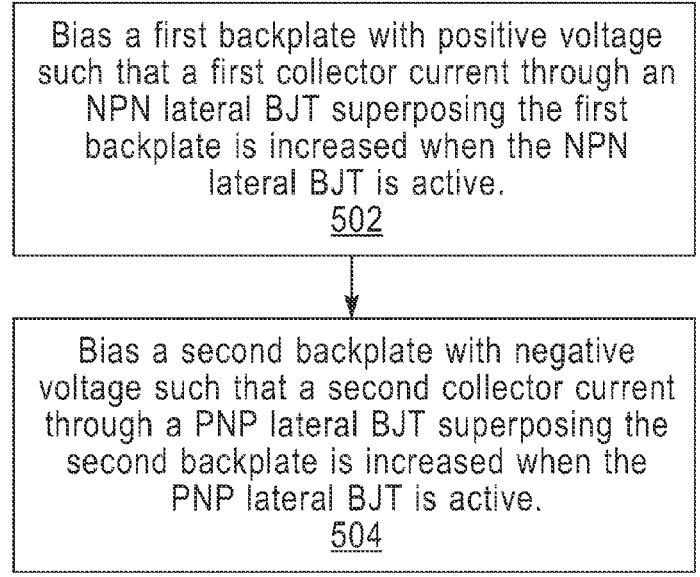
FIG. 5 shows an example method of operating a complementary bipolar junction transistor (BJT) circuit contemplated by an embodiment of the invention.

FIG. 5 illustrates a method of operating a complementary bipolar junction transistor (BJT) circuit contemplated by an embodiment of the invention. The method includes biasing operation 502. At biasing operation 502 a first backplate is biased with positive voltage such that a first collector current through an NPN lateral BJT superposing the first backplate is increased when the NPN lateral BJT is active.

The method further includes another biasing operation that biases a second backplate with negative voltage such that a second collector current through a PNP lateral BJT superposing the second backplate is increased when the PNP lateral BJT is active. As discussed above, the first backplate and the second backplate are electrically isolated from each other and are carried by a monolithic substrate.

Figure 6:
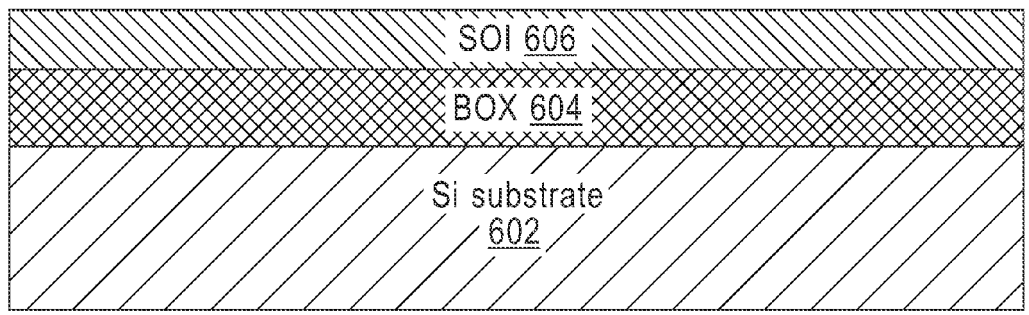
FIG. 6 shows a starting wafer for a process flow contemplated by one embodiment of the present invention.

FIG. 6 shows a starting wafer for a process flow contemplated by one embodiment of the present invention. The starting wafer includes a silicon substrate 602, a BOX layer 604, and an SOI layer 606.

Figure 7:
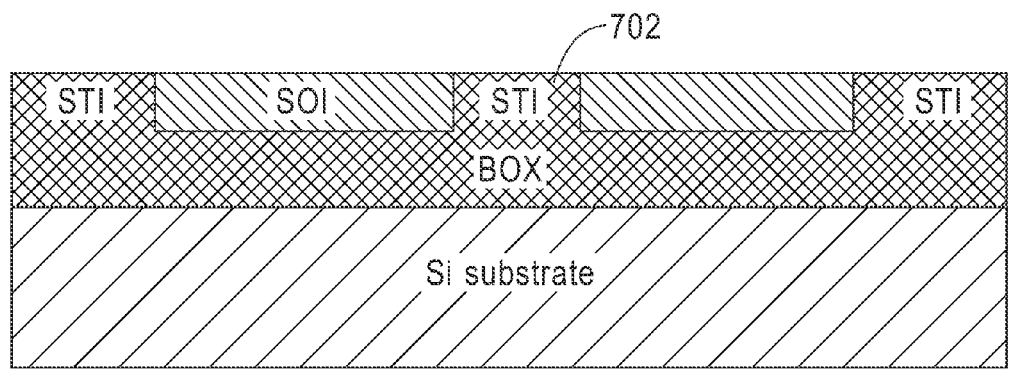
FIG. 7 shows STI structures formed to isolate areas where transistor devices will be constructed.

At FIG. 7, STI structures 702 are formed to isolate areas where transistor devices will be constructed. During this step, trenches are etched in the SOI layer using, for example, a plasma etch. The trenches are backfilled with a nonconductive oxide material, then polished.

Figure 8:
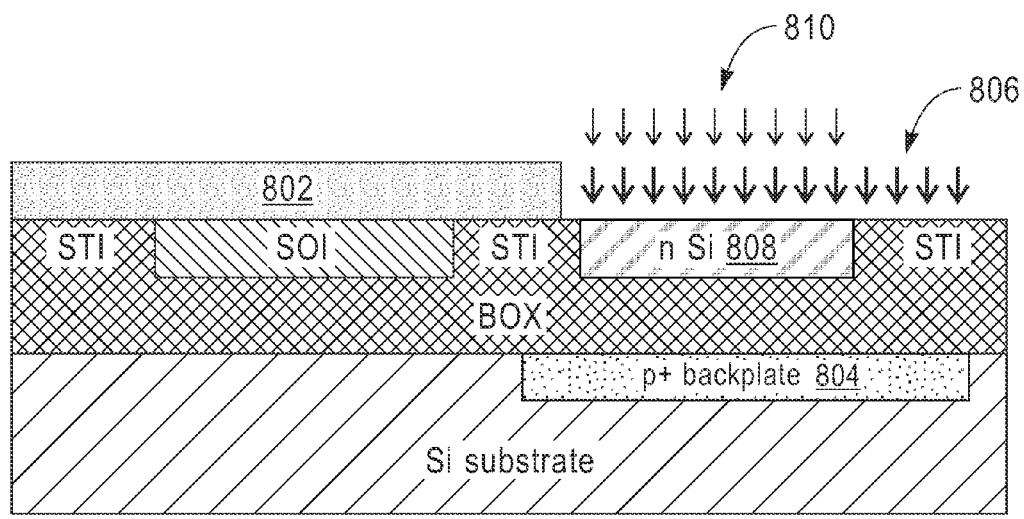
FIG. 8 shows a mask deposited over the NPN device side.

At FIG. 8, a mask 802 is deposited over the NPN device side. A PNP backplate 804 is then formed below the PNP device side by implanting p+ material 806, such as boron or boron difluoride, in the silicon substrate layer. Next, an n-type active area 808 of the PNP BJT device is formed by implanting n-type doping material 810, such as phosphorous or arsenic, in the SOI layer.

Figure 9:
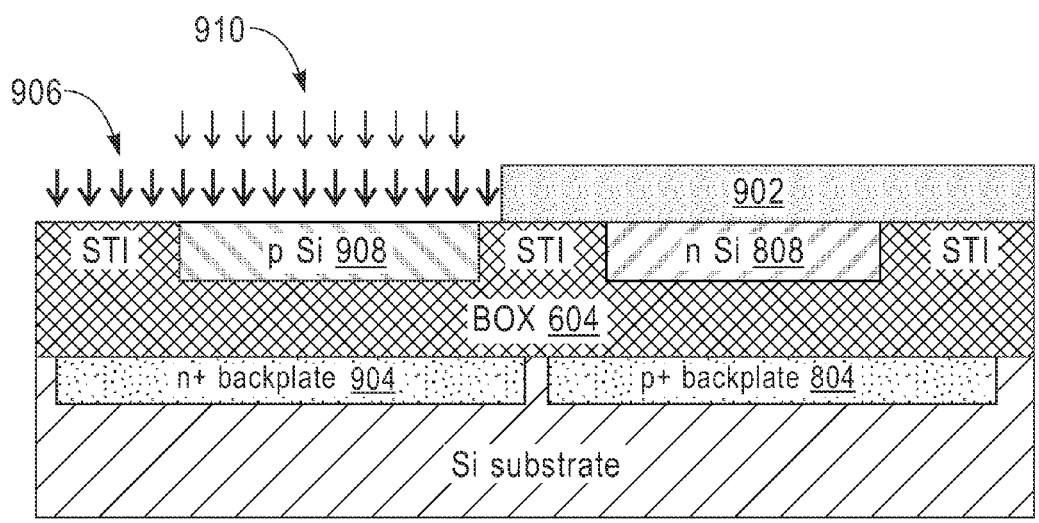
FIG. 9 shows a mask deposited over the PNP device side.

At FIG. 9, a mask 902 is deposited over the PNP device side. An NPN backplate 904 is then formed below the NPN device side by implanting n+ material 906, such as phosphorous or arsenic, in the silicon substrate layer. Next, a p-type active area 908 of the NPN BJT device is formed by implanting p-type doping material 910, such as boron or boron difluoride, in the SOI layer.

Figure 10:
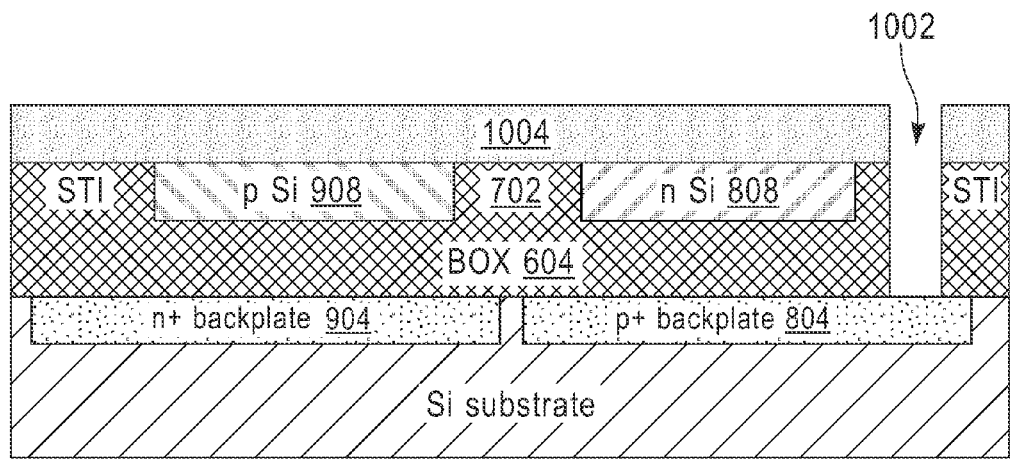
FIG. 10 shows a PNP backplate via formed from the STI layer, through the BOX layer, and down to the PNP backplate.

At FIG. 10, a PNP backplate via 1002 is formed from the STI layer 702, through the BOX layer 604, and down to the PNP backplate 804. A photolithography hardmask 1004 is used to define the via area. Reactive ion etching (RIE) is used to produce the PNP backplate via 1002.

Figure 11:
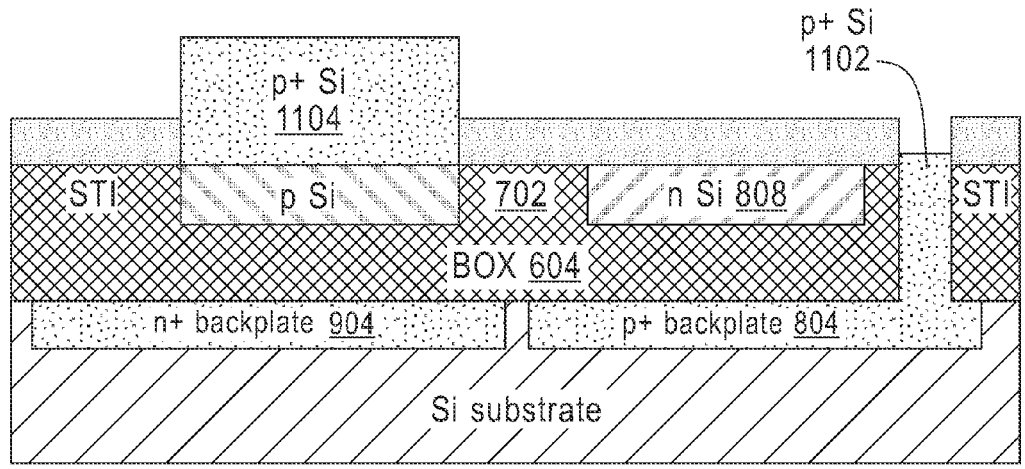
FIG. 11 shows opening a mask area above the NPN device side.

At FIG. 11, the mask area above the NPN device side is opened using RIE. Next, p+ silicon is deposited over the NPN device side and inside the PNP backplate via using epitaxial growth. Thus, a PNP backplate contact 1102 and the NPN p+ silicon layer 1104 is grown simultaneously.

Figure 12:
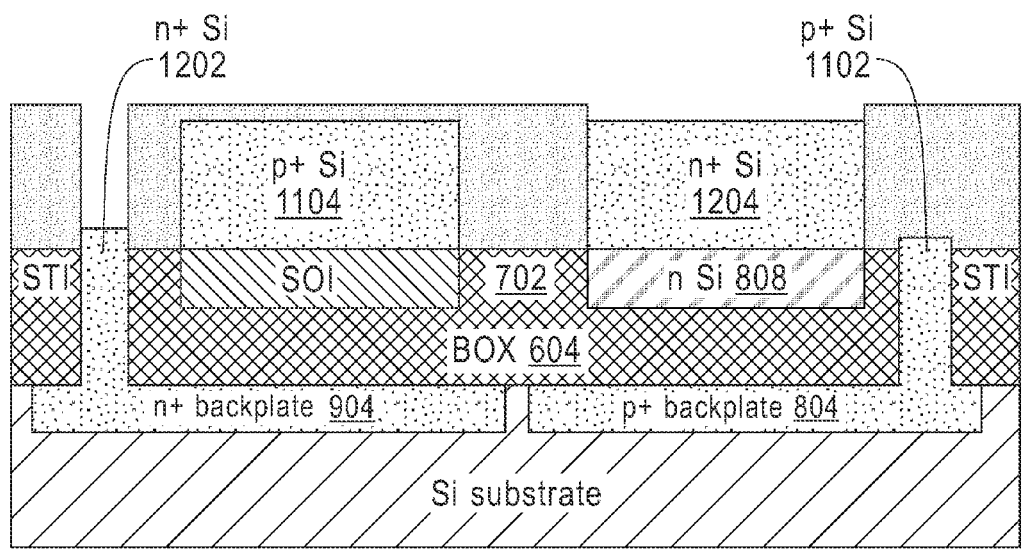
FIG. 12 shows forming an NPN backplate via from the STI layer, through the BOX layer, and down to the NPN backplate.

At FIG. 12, an NPN backplate via is formed from the STI layer, through the BOX layer, and down to the NPN backplate. The mask area above the PNP device side is opened using RIE. Next, n+ silicon is deposited over the PNP device side and inside the NPN backplate via using epitaxial growth. Thus, an NPN backplate contact 1202 and the PNP p+ silicon layer 1204 is grown simultaneously.

Figure 13:
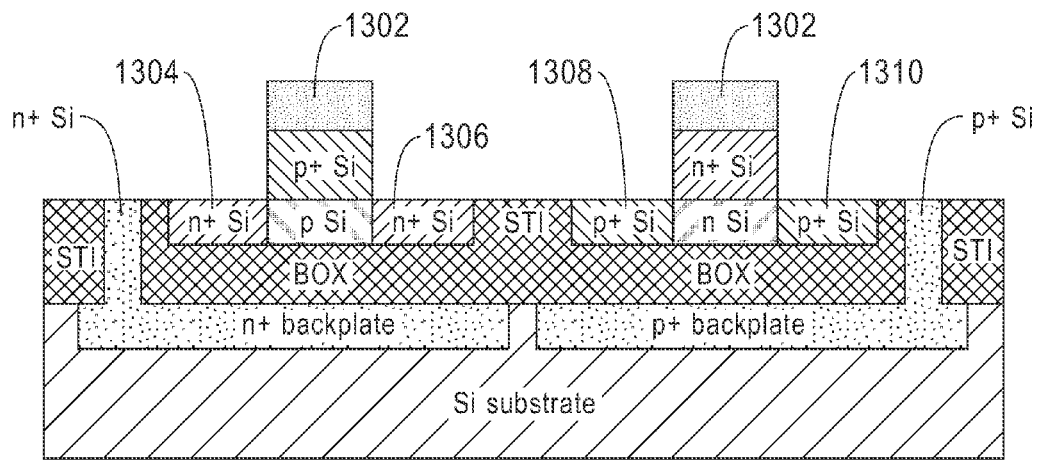
FIG. 13 shows a base hardmask used to define the base areas at the NPN and PNP transistors.

At FIG. 13, the base areas at the NPN and PNP transistors are defined using a base hardmask 1302 and RIE. Furthermore, collector and emitter implanting is performed on the NPN BJT and the PNP BJT by masking the respective regions. Specifically, the collector region 1304 and emitter region 1306 of the NPN BJT are implanted with n+ material. The collector region 1308 and emitter region 1310 of the PNP BJT are implanted with p+ material.

Figure 14:
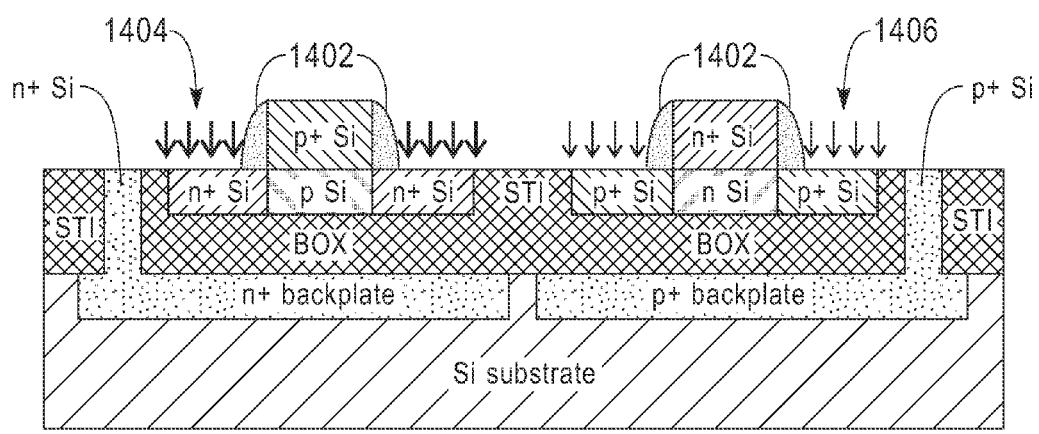
FIG. 14 shows an alternative embodiment of the process step shown in FIG. 13.

FIG. 14 shows an alternative embodiment of the process step shown in FIG. 13. In this embodiment, base spacers 1402 are formed along the sidewalls of the NPN and PNP bases before n+ material 1404 is implanted at the collector region and emitter region of the NPN BJT and the p+ material is implanted at the collector region and emitter region of the PNP BJT.

Figure 15:
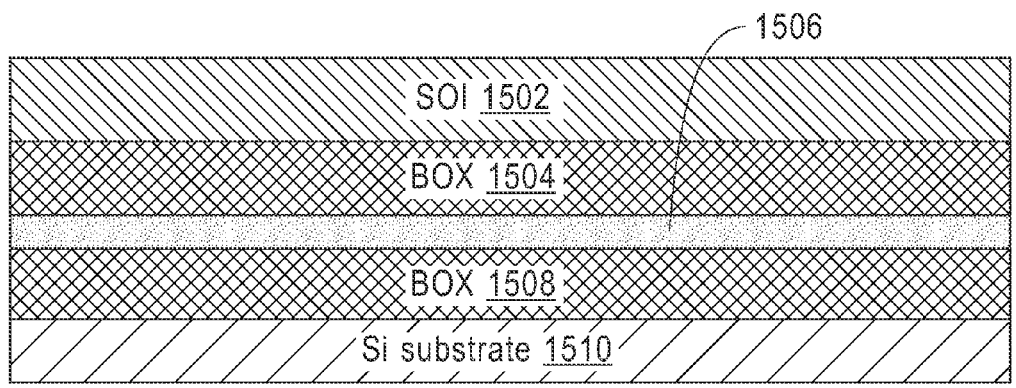
FIG. 15 shows an example starting substrate for the double BOX structure of FIG. 2.

FIG. 15 shows an example starting substrate for the double BOX structure of FIG. 2. The starting substrate includes an SOI layer 1502, a top BOX layer 1504, an intermediate Si layer 1506, a bottom BOX layer 1508, and a bottom Si layer 1510. In one embodiment, the starting substrate may be formed by bonding an SOI wafer to a BOX Si wafer with a thermal oxide layer.

Figure 16:
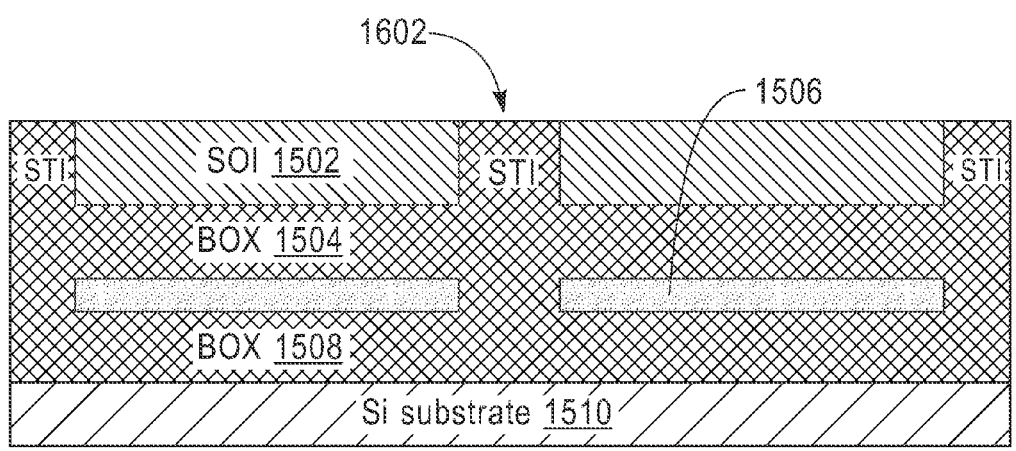
FIG. 16 shows formation of STI structures to isolate areas where transistor devices will be constructed.

At FIG. 16, STI structures 1602 are formed to isolate the areas where transistor devices will be constructed. During this step, trenches are etched in the SOI layer 1502, the top BOX layer 1504 and the intermediate Si layer 1506 using, for example, a plasma etch. The trenches are backfilled with a nonconductive oxide material, then polished. The remaining fabrication steps are similar to those discussed above.

Figure 17:
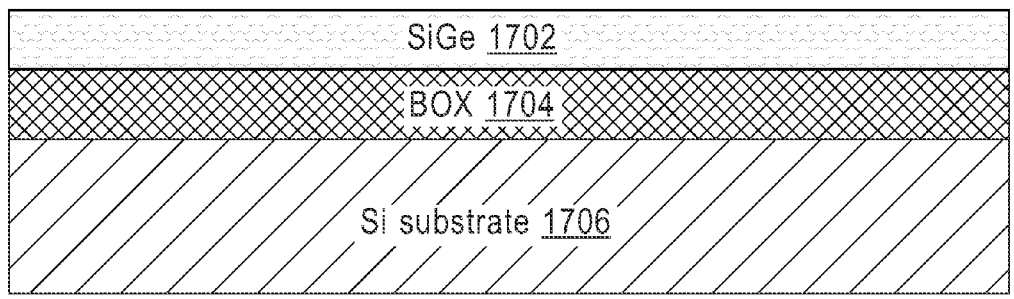
FIG. 17 shows an example starting substrate for the heterojunction bipolar transistor structure of FIG. 3.

FIG. 17 shows an example starting substrate for the heterojunction bipolar transistor structure of FIG. 3. The starting substrate includes a SiGe layer 1702, a BOX layer 1704, and a Si layer 1706. In one embodiment, the starting substrate may be formed by growing a SiGe layer over an SOI wafer.

Figure 18:
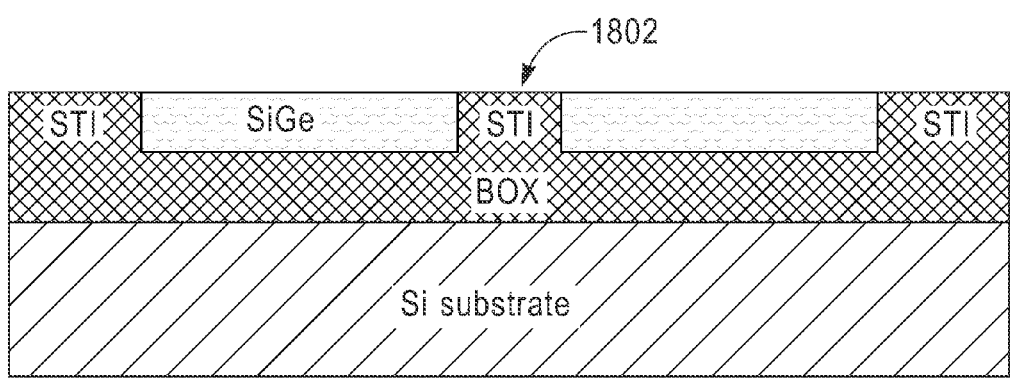
FIG. 18 shows formation of STI structures to isolate areas where transistor devices will be constructed.

At FIG. 18, STI structures 1802 are formed to isolate areas where transistor devices will be constructed. During this step, trenches are etched in the SiGe layer using, for example, a plasma etch. The trenches are backfilled with a nonconductive oxide material, then polished.

Figure 19:
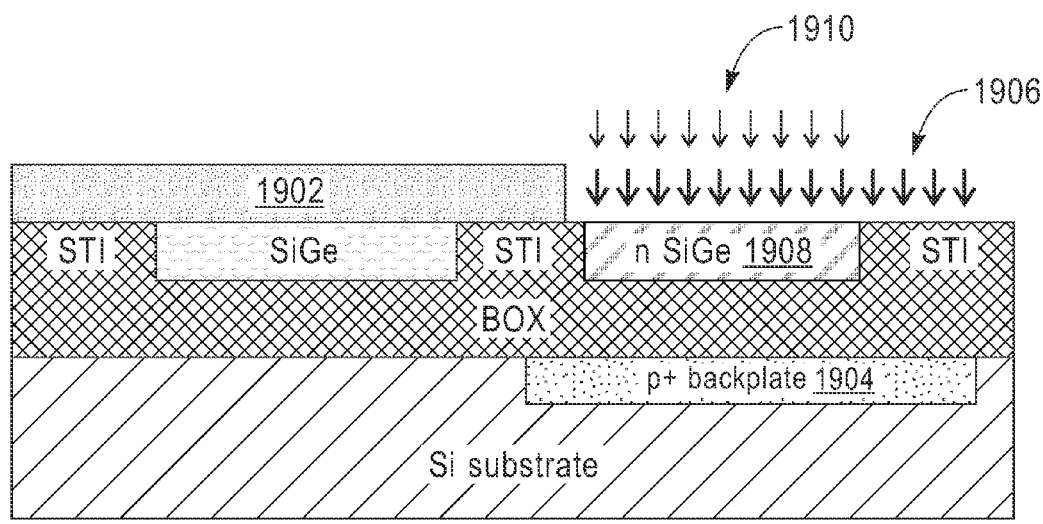
FIG. 19 shows deposition of a mask over the NPN device side.

At FIG. 19, a mask 1902 is deposited over the NPN device side. A PNP backplate 1904 is then formed below the PNP device side by implanting p+ material 1906, such as boron or boron fluoride, in the silicon substrate layer. Next, an n-type active area 1908 of the PNP BJT device is formed by implanting n-type doping material 1910, such as phosphorous or arsenic, in the SiGe layer.

Figure 20:
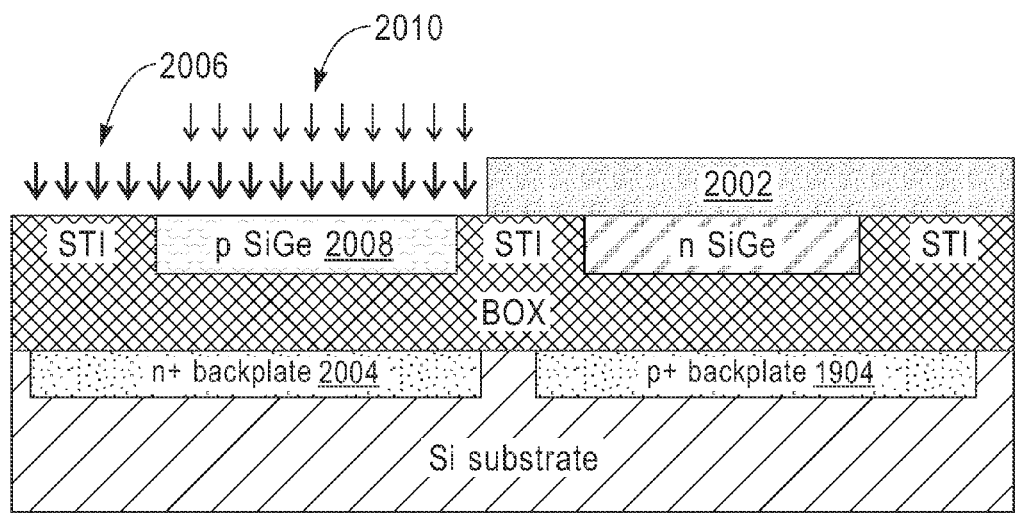
FIG. 20 shows deposition of a mask over the PNP device side.

At FIG. 20, a mask 2002 is deposited over the PNP device side. AN NPN backplate 2004 is then formed below the NPN device side by implanting n+ material 2006, such as phosphorous or arsenic, in the silicon substrate layer. Next, a p-type active area 2008 of the NPN BJT device is formed by implanting p-type doping material 2010, such as boron or boron difluoride, in the SiGe layer.

Figure 21:
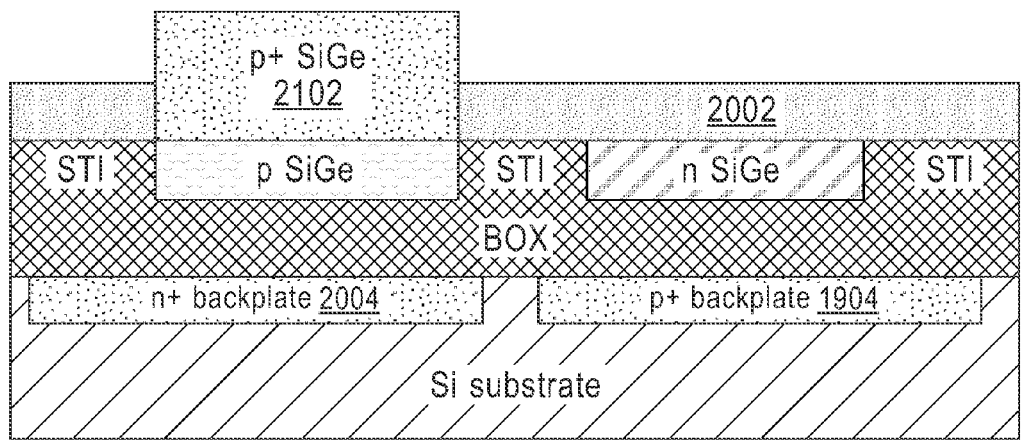
FIG. 21 shows opening a mask area above the NPN device side.

At FIG. 21, a mask area above the NPN device side is opened using RIE. Next, p+ SiGe 2102 is deposited over the NPN device side using epitaxial growth.

Figure 22:
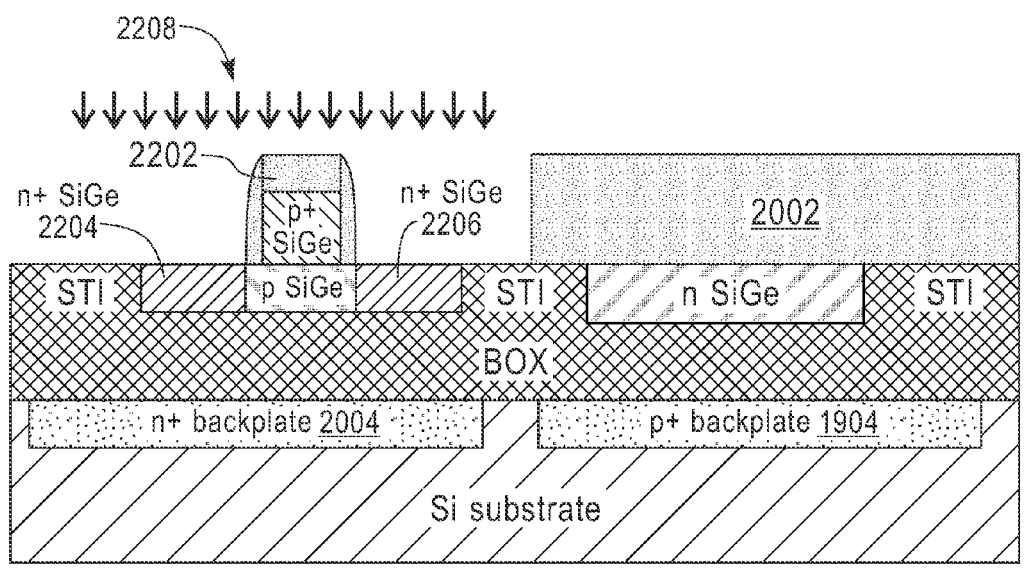
FIG. 22 shows defining the base area of the NPN transistor is defined using a base hardmask 2202 and RIE.

At FIG. 22, the base area of the NPN transistor is defined using a base hardmask 2202 and RIE. Furthermore, collector and emitter implanting is performed on the NPN BJT by masking the PNP region. Specifically, the collector region 2204 and emitter region 2206 of the NPN BJT are implanted with n+ material 2208.

Figure 23:
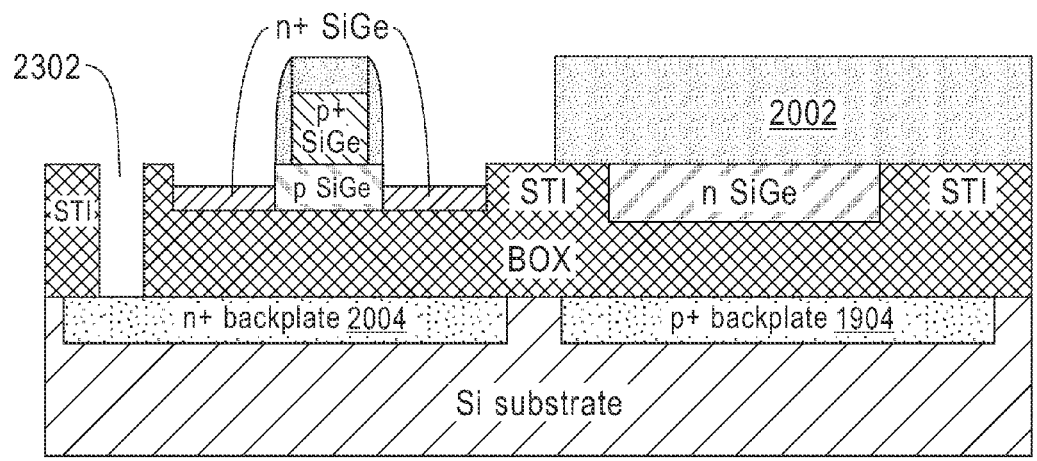
FIG. 23 shows recessing the collector region and emitter region of the NPN BJT.

At FIG. 23, the collector region and emitter region of the NPN BJT are recessed. Furthermore, an NPN backplate via 2302 is formed from the STI layer, through the BOX layer, and down to the NPN backplate 2004.

Figure 24:
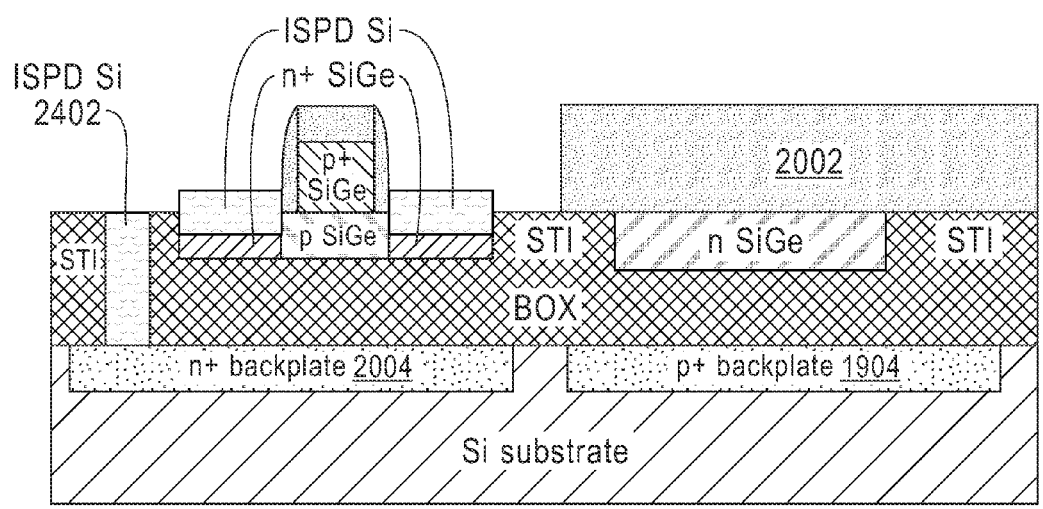
FIG. 24 shows deposition of in-situ phosphorous doped silicon inside the NPN backplate via and the recessed portions of the collector region and emitter region of the NPN BJT.

At FIG. 24, in-situ phosphorous doped silicon is deposited inside the NPN backplate via and the recessed portions of the collector region and emitter region of the NPN BJT. Thus, an NPN backplate contact 2402 is formed.

Figure 25:
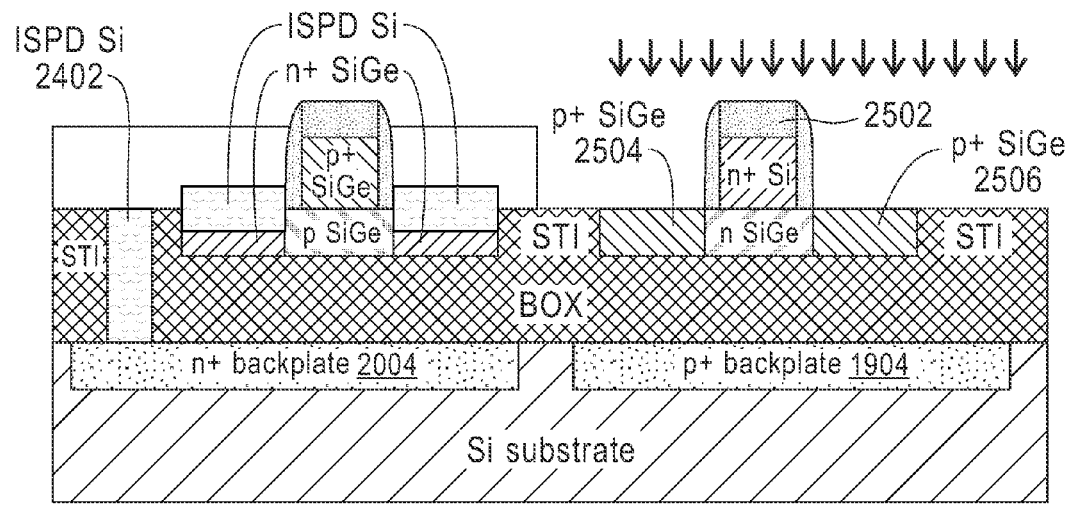
FIG. 25 shows using a base hardmask to define the base area of the PNP transistor.

At FIG. 25, the base area of the PNP transistor is defined using a base hardmask 2502 and RIE. Furthermore, collector and emitter implanting is performed on the PNP BJT by masking the NPN region. Specifically, the collector region 2504 and emitter region 2506 of the PNP BJT are implanted with p+ material.

Figure 26:
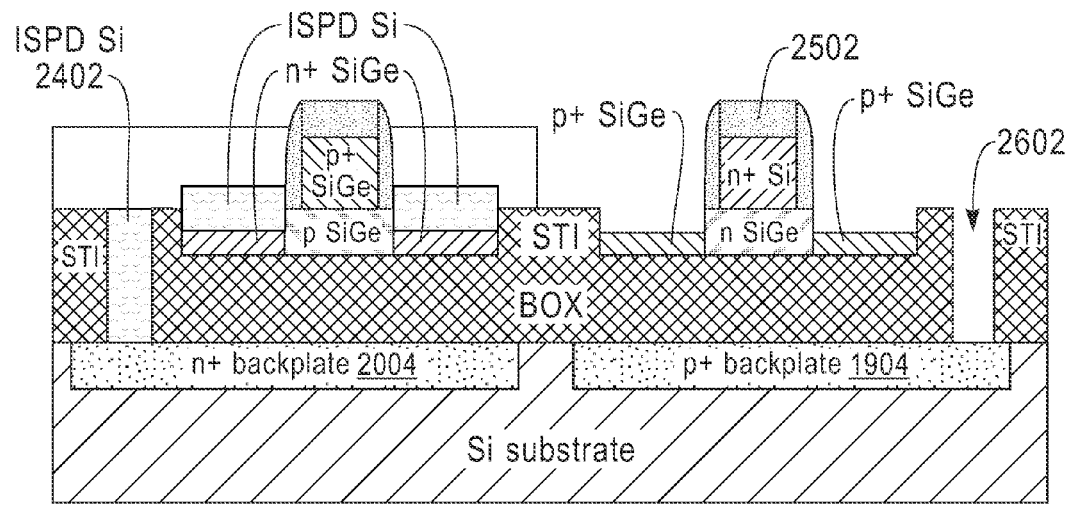
FIG. 26 shows recessing the collector region and emitter region of the PNP BJT.

At FIG. 26, the collector region and emitter region of the PNP BJT are recessed. Furthermore, a PNP backplate via 2602 is formed from the STI layer, through the BOX layer, and down to the PNP backplate 1904.

Figure 27:
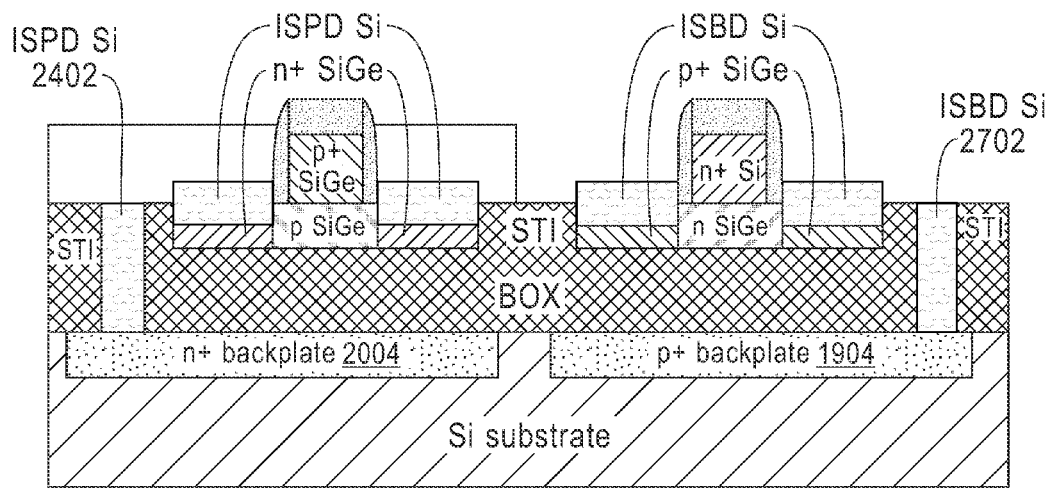
FIG. 27 shows deposition of in-situ boron doped silicon inside the PNP backplate via and the recessed portions of the collector region and emitter region of the PNP BJT
Figure 28:
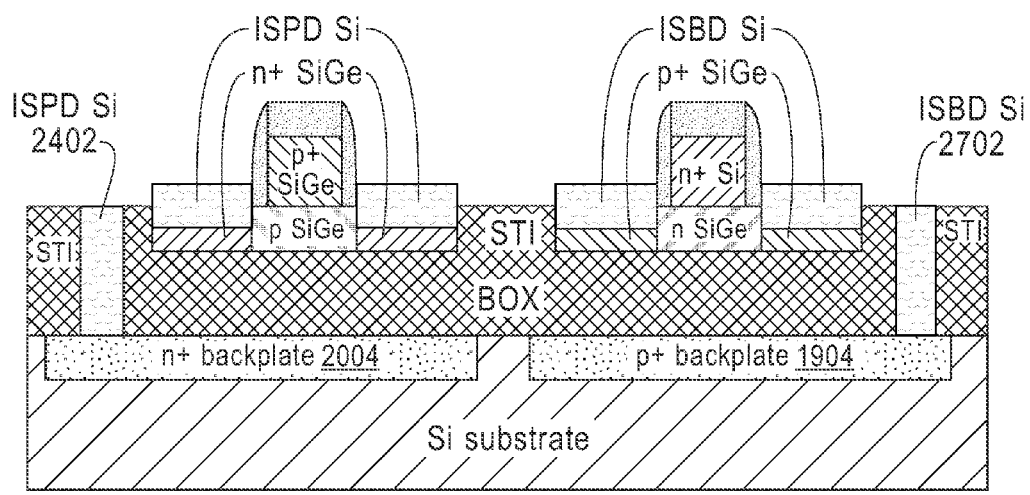
FIG. 28 shows removal of the hardmask over the NPN transistor.

At FIG. 27, in-situ boron doped silicon is deposited inside the PNP backplate via and the recessed portions of the collector region and emitter region of the PNP BJT. Thus, a PNP backplate contact 2702 is formed. At FIG. 28, the hardmask over the NPN transistor is removed.

Figure 29:
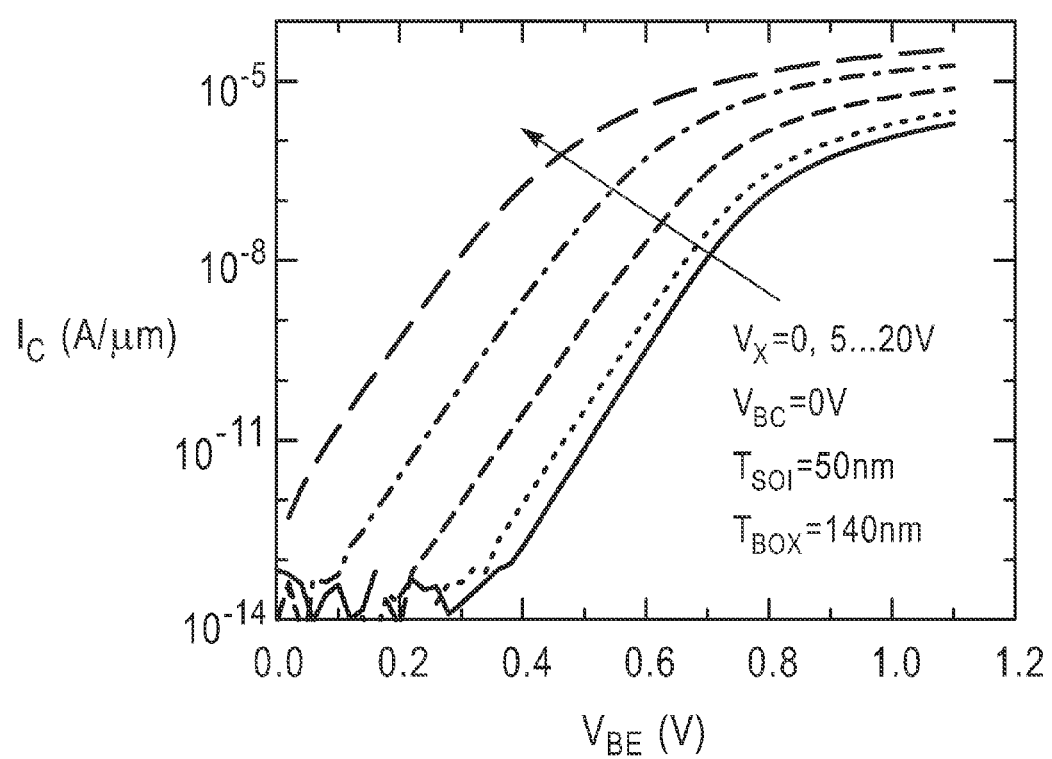
FIG. 29 shows that the complementary lateral BJT with positive backplate bias for an NPN transistor beneficially increases Ic as a function of +ve Vx (backplate bias) with relatively little change in Ib.

FIG. 29 shows that the complementary lateral BJT with positive backplate bias for an NPN transistor beneficially increases Ic as a function of +ve Vx (backplate bias) with relatively little change in Ib. In this graph, the rightmost curves shows Ic with no backplate bias voltage applied. Ic progressively increases (5V, 10V, 15V, 20V) as more backplate bias voltage is applied.

The current gain increases in proportion to Ic increase may be achieved by greater than $10^4$ times for low $N_B$. In energy band terms, the energy band diagram near the BOX is bent downward when drawn. Thus, the backplate bias voltage assists electrons to be injected from the emitter over an energy barrier, which is lowered by the backplate bias, into the base.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A complementary bipolar junction transistor (BJT) integrated structure comprising:
   a monolithic substrate;
   an electrically conductive first backplate positioned over the monolithic substrate;
   an electrically conductive second backplate positioned over the monolithic substrate, the first backplate and the second backplate being electrically isolated from each other;
   an NPN lateral BJT superposing the first backplate, the NPN lateral BJT configured to conduct electricity horizontally between an NPN emitter and an NPN collector when the NPN lateral BJT is active;
   a PNP lateral BJT superposing the second backplate, the PNP lateral BJT configured to conduct electricity horizontally between a PNP emitter and a PNP collector when the PNP lateral BJT is active; and
   a first buried oxide (BOX) layer positioned between the NPN lateral BJT and the first backplate, and between the PNP lateral BJT and the second backplate.

2. The complementary BJT integrated structure of claim 1, further comprising:
   a first contact electrically coupled to the first backplate and extending vertically from the first backplate through the first BOX layer; and
   a second contact electrically coupled to the second backplate and extending vertically from the second backplate through the first BOX layer.

3. The complementary BJT integrated structure of claim 1, wherein top surfaces of the NPN emitter, the NPN collector, the PNP emitter and the PNP collector are on a same horizontal plane.

4. The complementary BJT integrated structure of claim 1, wherein the first backplate is n+ doped and positioned under the NPN lateral BJT, and the second backplate is p+ doped and is positioned under the PNP lateral BJT.

5. The complementary BJT integrated structure of claim 1, wherein the monolithic substrate is p doped.

6. The complementary BJT integrated structure of claim 1, wherein the NPN lateral BJT and the PNP lateral BJT are heterojunction BJTs.

7. The complementary BJT integrated structure of claim 1, further comprising:
   a plurality of NPN lateral BJTs superposing the first backplate, the NPN lateral BJT being one of the plurality of NPN lateral BJTs; and
   a plurality of PNP lateral BJTs superposing the second backplate, the PNP lateral BJT being one of the plurality of PNP lateral BJTs.

8. The complementary BJT integrated structure of claim 1, wherein a second BOX layer is positioned between the first backplate and the monolithic substrate, and between the second backplate and the monolithic substrate, such that the first backplate and the second backplate are electrically isolated from the monolithic substrate.

9. The complementary BJT integrated structure of claim 1, further comprising:
  wherein the NPN lateral BJT includes an NPN base;
  wherein the PNP lateral BJT includes a PNP base;
  wherein the NPN base is electrically coupled to the PNP base; and
  wherein the NPN collector is electrically coupled to the PNP collector.

10. The complementary BJT integrated structure of claim 1, further comprising a shallow trench isolation (STI) between the NPN lateral BJT and the PNP lateral BJT.

* * * * *